(12) United States Patent
Lee et al.

(10) Patent No.: US 9,168,468 B2
(45) Date of Patent: Oct. 27, 2015

(54) SYSTEM AND METHOD FOR RECYCLING HIGH-BOILING-POINT WASTE PHOTORESIST STRIPPER

(71) Applicant: KOREX CORPORATION, Anyang-si, Gyeonggi-do (KR)

(72) Inventors: Ho Kyung Lee, Seoul (KR); In Gyoo Lee, Anyang-si (KR); Myung Jun Park, Hwaseong-si (KR); Kee-Kahb Koo, Seoul (KR); Jae-Kyeong Kim, Seoul (KR)

(73) Assignee: KOREX CORPORATION, Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/601,517

(22) Filed: Jan. 21, 2015

(65) Prior Publication Data

US 2015/0129409 A1    May 14, 2015

Related U.S. Application Data

(62) Division of application No. 14/184,159, filed on Feb. 19, 2014, now Pat. No. 8,961,744.

(30) Foreign Application Priority Data

Feb. 25, 2013 (KR) .................... 10-2013-0019743
Mar. 6, 2013 (KR) .................... 10-2013-0023760

(51) Int. Cl.
*B01D 3/14* (2006.01)
*B01D 15/00* (2006.01)
(Continued)

(52) U.S. Cl.
CPC ............... *B01D 3/143* (2013.01); *B01D 3/106* (2013.01); *B01D 3/146* (2013.01); *B01D 3/30* (2013.01);
(Continued)

(58) Field of Classification Search
CPC ........ B01D 3/143; B01D 3/146; B01D 5/006; B01D 5/0072; B01D 15/00; G03F 7/42
USPC ............ 202/158, 161; 203/39, 47, 48, 71, 81, 203/87, 99; 210/663, 767; 261/128; 510/176
See application file for complete search history.

(56) References Cited

U.S. PATENT DOCUMENTS 3,344,040 A * 9/1967 Rijnsdorp ................ 203/1
5,811,597 A * 9/1998 Hwan et al. ............... 568/697
(Continued)

FOREIGN PATENT DOCUMENTS

| JP | 2005288329 A | 10/2005 | |
| KR | 1020090025102 A | 3/2009 | |
| KR | 1020090025104 A | 3/2009 | |
| WO | WO2009031731 | * 3/2009 | .......... G03F 7/42 |

*Primary Examiner* — In Suk Bullock
*Assistant Examiner* — Jonathan Miller
(74) *Attorney, Agent, or Firm* — Hauptman Ham, LLP

(57) ABSTRACT

In a system for recycling a high-boiling-point waste photoresist stripper generated in processes of manufacturing LCDs or semiconductor devices, wherein an expensive high-boiling-point stripper solvent can be easily recycled at high yield and high-purity electronic grade. This system includes a first distillation device for removing low-boiling-point impurities, a second distillation device for recycling a stripper solvent composition while removing high-boiling-point impurities, a third distillation device for removing trace water, thus recovering the stripper solvent composition, a fourth distillation device for additionally recycling a stripper solvent, thus additionally recovering a high-boiling-point stripper solvent, and a fifth distillation device for sequentially and separately recovering the stripper solvent composition recovered by the second distillation device and the high-boiling-point stripper solvent additionally recovered by the fourth distillation device.

12 Claims, 2 Drawing Sheets

(51) Int. Cl.
*B01D 5/00* (2006.01)
*G03F 7/42* (2006.01)
*B01D 3/10* (2006.01)
*B01D 3/30* (2006.01)
*B01D 3/32* (2006.01)
*B01D 3/42* (2006.01)
*G03F 7/26* (2006.01)

(52) U.S. Cl.
CPC .............. *B01D 3/322* (2013.01); *B01D 3/4283* (2013.01); *B01D 5/006* (2013.01); *B01D 5/0072* (2013.01); *B01D 15/00* (2013.01); *G03F 7/26* (2013.01); *G03F 7/42* (2013.01)

(56) References Cited

U.S. PATENT DOCUMENTS

| | | | | |
|---|---|---|---|---|
| 5,925,224 | A * | 7/1999 | Kobayashi et al. | 203/47 |
| 5,994,597 | A * | 11/1999 | Bhatt et al. | 568/810 |
| 6,106,722 | A * | 8/2000 | Chew et al. | 210/651 |
| 6,612,317 | B2 * | 9/2003 | Costantini et al. | 134/58 R |
| 7,273,560 | B2 * | 9/2007 | Su et al. | 210/739 |
| 2004/0182752 | A1 * | 9/2004 | Reyneke et al. | 208/351 |
| 2004/0266974 | A1 * | 12/2004 | Murthy et al. | 528/196 |
| 2014/0083458 | A1 * | 3/2014 | Fuchigami et al. | 134/12 |

* cited by examiner

SYSTEM AND METHOD FOR RECYCLING HIGH-BOILING-POINT WASTE PHOTORESIST STRIPPER

CROSS REFERENCE TO RELATED APPLICATION

The present application is a Divisional Application of U.S. Ser. No. 14/184,159 filed Feb. 19, 2014. It claims the priority of Korean Patent Application No. 10-2013-019743 filed on Feb. 25, 2013, and No. 10-2013-0023760 filed on Mar. 6, 2013, in the KIPO (Korean Intellectual Property Office), which is incorporated herein by reference in its entirety.

BACKGROUND OF THE INVENTION

1. Field of the Invention

The present invention relates to a system for recycling a high-boiling-point waste photoresist stripper, and more particularly, to a system and method for recycling a high-boiling-point waste photoresist stripper, wherein an expensive high-boiling-point stripper solvent may be easily recycled at high yield and in the level of high-purity electronic grade from a high-boiling-point waste photoresist stripper generated in a process of manufacturing a liquid crystal display or a semiconductor device.

2. Description of the Related Art

With the drastic advancement of information communication industries, the demand for electronic devices and liquid crystal displays (LCDs) using a variety of semiconductor devices is continuously increasing. Accordingly, a photoresist, which is a key to the formation of a micropattern of a wafer and a circuit board, and an expensive stripper for dilution and removal of such a photoresist are increasingly required, and furthermore, the need for recycling such a stripper used is on the rise.

For example, a waste stripper is mainly generated during a photo process for forming a circuit pattern in the course of manufacturing electronic parts such as semiconductor wafers, LCDs, glass substrates, etc., and the waste stripper contains not only stripper solvents but also a photoresist resin, water, impurities such as heavy metals, etc.

The waste stripper is mostly removed by way of incineration or landfill after simple pre-treatment, but may cause environmental problems and treatment cost problems from generation of the waste to removal thereof. Ultimately, competitiveness of IT industries may become weakened and thus ensuring resources through recycling of waste solvents is urgently required.

As electronic parts and devices combined with IT technology have been rapidly developed, kinds or functions of thinner and stripper used in the manufacturing processes have become diversified. Nevertheless, the amounts of main stripper solvents which are reused through recovery and purification after having been used for processes of manufacturing electronic parts such as TFT-LCD (which is an ultrathin film liquid crystal display), etc. are very small at the present time.

Particularly in TFT-LCD fields, substrates are large-sized and panel prices are falling, and thus the demand for processing cost savings is increasing. Under circumstances in which high prices of raw materials of thinners and strippers result from the recent rise in oil prices, cost competitiveness has to be ensured. Hence, when waste strippers are utilized again as raw materials through purification, the use of raw materials is reduced, and also, environmental problems which become more serious and treatment cost problems may be solved.

Extensive research to recycling techniques of the waste in a stripping process is ongoing these days in terms of economy, environment and efficiency. In regard to a waste stripper recycling technique, Korean Patent No. 0901001 and Japanese Patent Application Publication No. 2005-288329 disclose a technique for recycling a stripper solvent by removing a low-boiling-point material such as water, etc. and a high-boiling-point material such as a photoresist resin, etc., from the waste stripper, and Korean Patent No. 0899777 discloses a high-yield recycling method in which the recycling loss is minimized.

However, due to the recent advancement of LCD and semiconductor industries, a new type photoresist resin is being used depending on the development of a novel memory semiconductor, and a highly functional stripper organic solvent is required to easily dissolve the photoresist resin in the course of stripping the photoresist resin during the manufacturing process. Although the use of high-boiling-point stripper solvents having high stripper solubility is increasing, limitations are imposed on recycling the high-boiling-point stripper solvents using the recycling method as above.

In the recycling method as above, because of high-boiling-point properties, including high viscosity, thermal decomposition and color change, the high-boiling-point stripper organic solvents are difficult to separate and purify from heavy photoresist resin and metal components, and are allowed to excessively remain in order to prevent generation of processing difficulties, and then discarded together with high-boiling-point impurities.

Also, the recovery efficiency of high-boiling-point stripper organic solvents recovered by the conventional recycling methods approximates to 15%, which is regarded as economically insignificant. The quality including purity and color of the recovered high-boiling-point stripper solvents is poor and thus the recycling value thereof is low, which is undesirable.

The demand for techniques for recycling and recovering of expensive high-boiling-point stripper organic solvents is being agitated in the related industries, but there are still no alternatives to the recycling techniques at home and abroad.

Hence, there is an urgent need to secure advanced recycling techniques able to recover expensive high-boiling-point stripper organic solvents through recycling and purification from a photoresist residue which is being discarded, in addition to the typical stripper organic solvent of the waste photoresist stripper. If a high-boiling-point stripper solvent which is an expensive valuable resource completely imported from abroad is recovered in a large amount at high recovery efficiency and then reused, efficient energy management and competitiveness of IT related companies are likely to remarkably increase, and more practical environmental improvement effects are expected.

SUMMARY OF THE INVENTION

Therefore, the present invention has been made keeping in mind the problems encountered in the related art, such as low recycling yield of a high-boiling-point stripper solvent, and an object of the present invention is to provide a system for recycling a high-purity electronic grade high-boiling-point stripper solvent from a high-boiling-point waste photoresist stripper, which includes a first distillation device for removing low-boiling-point impurities from a high-boiling-point waste photoresist stripper generated in processes of manufacturing LCDs or semiconductor devices, a second distillation device for recycling a stripper solvent composition while removing high-boiling-point impurities, and a third distillation device for removing trace water to thus recover the stripper solvent composition, and also further includes a fourth distillation device for additionally recycling a stripper solvent, and thus a high-boiling-point stripper solvent discarded as a distillation residue together with the high-boiling-point impurities may be additionally recovered, thereby greatly increasing the recycling yield of the expensive high-boiling-point stripper solvent.

Another object of the present invention is to provide a method of recycling a high-purity electronic grade high-boiling-point stripper solvent from a high-boiling-point waste photoresist stripper, which includes removing low-boiling-point impurities from a high-boiling-point waste photoresist stripper generated in the processes of manufacturing LCDs or semiconductor devices, recycling a stripper solvent composition while removing high-boiling-point impurities, and removing trace water to thus recover the stripper solvent composition, and also further includes additionally recycling a stripper solvent, and thus a high-boiling-point stripper solvent discarded as a distillation residue together with the high-boiling-point impurities may be additionally recovered, thereby greatly increasing the recycling yield of the expensive high-boiling-point stripper solvent.

In order to accomplish the above objects, the present invention provides a system for recycling a high-boiling-point waste photoresist stripper, comprising a first distillation device, a second distillation device and a third distillation device, which are disposed in a line to perform total stripper recycling of a pretreated high-boiling-point waste photoresist stripper, the first distillation device for removing low-boiling-point impurities from the high-boiling-point waste photoresist stripper, the second distillation device for removing high-boiling-point impurities from the high-boiling-point waste photoresist stripper without the low-boiling-point impurities and simultaneously recovering a stripper solvent composition, and the third distillation device for removing trace water from the stripper solvent composition without the high-boiling-point impurities; and a fourth distillation device connected to an outlet of the second distillation device and disposed adjacent thereto to perform additional stripper recycling for additionally recovering a high-boiling-point stripper solvent from a high-boiling-point residue including the high-boiling-point impurities discharged after having been removed by the second distillation device.

Also in the present invention, a fifth distillation device is further disposed, which is connected to outlets of the second distillation device and the fourth distillation device to perform separate stripper recycling for separately recovering, as individual high-purity recycled strippers, the stripper solvent composition recovered by the second distillation device and the high-boiling-point stripper solvent additionally recovered by the fourth distillation device.

In an exemplary embodiment of the present invention, the first distillation device comprises a distillation tower, which has 15~25 theoretical plates for purification and receives the pretreated high-boiling-point waste photoresist stripper; a reboiler connected to a bottom of the distillation tower and set to a temperature of 80° C. or less so as to heat the waste stripper transported to the distillation tower to evaporate the low-boiling-point impurities; a condenser connected to a top of the distillation tower so as to condense the extracted low-boiling-point impurities; a temporary storage tank connected to the condenser so that the low-boiling-point impurities condensed by the condenser are temporarily stored; a second transport pump and a separate collection tank connected side by side to an outlet of the temporary storage tank to discharge the low-boiling-point impurities recovered in the temporary storage tank; and a third transport pump connected to an outlet of the reboiler to transport the waste stripper without the low-boiling-point impurities to the second distillation device.

Also, a vacuum pump may be connected to a top of the temporary storage tank to reduce an inner pressure of the distillation tower so that vacuum operation is carried out, in order to prevent promotion of thermal decomposition when the high-boiling-point waste stripper in the distillation tower of the first distillation device is heated.

In an exemplary embodiment of the present invention, the second distillation device comprises a distillation tower, which has 7~15 theoretical plates for purification and receives the waste stripper transported from the reboiler of the first distillation device; a reboiler connected to a bottom of the distillation tower and set to a temperature of 160° C. or less so as to heat the waste stripper transported to the distillation tower to evaporate the stripper solvent composition; a condenser connected to a top of the distillation tower so as to condense the extracted stripper solvent composition; a temporary storage tank for temporarily storing the stripper solvent composition recovered after having been condensed by the condenser; and a fifth transport pump and a sixth transport pump connected side by side to an outlet of the temporary storage tank so that the stripper solvent composition recovered in the temporary storage tank is transported to the third distillation device.

Also, a vacuum pump may be connected to a top of the temporary storage tank to reduce an inner pressure of the distillation tower so that vacuum operation is carried out, in order to prevent promotion of thermal decomposition when a stripper solvent component contained in the waste stripper in the distillation tower of the second distillation device is heated.

In an exemplary embodiment of the present invention, the third distillation device comprises a distillation tower, which has 25~35 theoretical plates for purification and receives the stripper solvent composition obtained by the second distillation device; a reboiler separately connected to a bottom of the distillation tower and set to a temperature of 110° C. or less to remove trace water from the stripper solvent composition transported to the distillation tower; a condenser connected to a top of the distillation tower so that the removed trace water and volatiles are condensed to be re-circulated to the first distillation device; an additional condenser connected to the top of the distillation tower so as to condense a part of the stripper solvent which is volatilized from the top of the tower; a temporary storage tank for temporarily storing the part of the stripper solvent condensed by the additional condenser; and an eighth transport pump for finally transporting the stripper solvent in the temporary storage tank and the remaining stripper solvent in the bottom of the distillation tower and the reboiler, to a recycled stripper mixture storage tank.

Also, a vacuum pump may be connected to a top of the temporary storage tank to reduce an inner pressure of the distillation tower so that vacuum operation is carried out, in order to prevent promotion of thermal decomposition when a stripper solvent component contained in the waste stripper in the distillation tower of the third distillation device is heated.

In an exemplary embodiment of the present invention, the fourth distillation device comprises a temporary storage tank for temporarily storing a waste byproduct which is a high-boiling-point residue left behind in the bottom of the tower of the second distillation device and the reboiler; a distillation tower, which has 8~12 theoretical plates for purification and receives the waste byproduct in the temporary storage tank by actuation of a ninth transport pump; a reboiler separately connected to a bottom of the distillation tower and set to a temperature of 160° C. or less so as to heat the waste byproduct transported to the distillation tower to evaporate the stripper solvent composition; a condenser connected to a top of the distillation tower so as to condense the stripper solvent volatilized from the waste byproduct; a temporary storage tank for recovering and temporarily storing the condensed stripper solvent; and a twelfth transport pump and a thirteenth transport pump connected to an outlet of the temporary storage tank so as to transport the recovered stripper solvent to the recycled stripper mixture storage tank.

Also, a vacuum pump may be connected to a top of the temporary storage tank to reduce an inner pressure of the distillation tower so that vacuum operation is carried out, in order to prevent promotion of thermal decomposition when a high-boiling-point stripper solvent component of the waste byproduct in the above distillation tower is heated.

In a further exemplary embodiment of the present invention, the fourth distillation device further comprises, as control members for maximally increasing a recycling yield of the stripper solvent composition while maximally retarding deposition of a photoresist resin, a viscometer for monitoring an extent of viscosification of the high-boiling-point stripper solvent contained in the high-boiling-point residue when the photoresist resin, which is not sufficiently concentrated, of the waste byproduct in the reboiler is transported to an impurity collection tank and discarded; a first flow rate control valve disposed together with a tenth transport pump in a circulation line upwards from an outlet of the reboiler; a second flow rate control valve disposed together with an eleventh transport pump in a connection line between the outlet of the reboiler and the collection tank; and a controller for controlling opening/closing of the first and second flow rate control valves depending on measurement results of the viscometer.

In an exemplary embodiment of the present invention, the fifth distillation device comprises a spiral spinning band type distillation tower including therein a spiral stirring type column device made of metal or Teflon so that the stripper solvent composition recovered through the second removal step using the second distillation device, and the high-boiling-point stripper solvent recovered using the fourth distillation device are recovered as individual high-purity electronic grade recycled stripper solvents depending on a boiling point.

In an exemplary embodiment of the present invention, a 1-micron filter is disposed in a connection line between the outlet of the temporary storage tank of the third distillation device and the recycled stripper mixture storage tank, and in a connection line between an outlet of the fifth distillation device and individual stripper solvent storage tanks.

In addition, the present invention provides a method of recycling a high-boiling-point waste photoresist stripper, comprising pretreating the high-boiling-point waste photoresist stripper to remove a solid, an insoluble denatured photoresist component and an organic acid component therefrom; subjecting the pretreated high-boiling-point waste photoresist stripper to total stripper recycling including a first removal step for removing low-boiling-point impurities from the high-boiling-point waste photoresist stripper, a second removal step for recovering a stripper solvent composition while removing high-boiling-point impurities from the high-boiling-point waste photoresist stripper without the low-boiling-point impurities, and a third removal step for removing trace water from the stripper solvent composition without the high-boiling-point impurities, thus obtaining a high-purity recycled stripper mixture; and performing additional stripper recycling so that a high-boiling-point stripper solvent is additionally recovered from a high-boiling-point residue including the high-boiling-point impurities removed by the second removal step of the total stripper recycling.

Also, the method of the present invention further includes separate stripper recycling so that the stripper solvent composition recovered by the second removal step of the total stripper recycling and the high-boiling-point stripper solvent additionally recovered through the additional stripper recycling are separately recovered as individual high-purity recycled strippers.

In an exemplary embodiment of the present invention, the pretreating comprises neutralization for maintaining pH of the high-boiling-point waste stripper to 6.5~8.5 so as to remove the organic acid component; precipitation for 1~12 hr so as to remove a neutralized product and floating and insoluble components generated in a stripping process; and filtration including primary filtration using a 20~100 μm sieve and secondary filtration using a 0.1~10 μm sieve.

In an exemplary embodiment of the present invention, the first removal step of the total stripper recycling comprises heating the high-boiling-point waste photoresist stripper transported to a distillation tower of a first distillation device to a temperature equal to or higher than a boiling point of water so as to enable evaporation of the low-boiling-point impurities; performing first distillation by maintaining a temperature of a reboiler connected to the distillation tower of the first distillation device to 85° C. or less; and reducing an inner pressure of the distillation tower of the first distillation device to prevent promotion of thermal decomposition of the high-boiling-point stripper solvent contained in the high-boiling-point waste photoresist stripper; and condensing and collecting the extracted low-boiling-point impurities.

In an exemplary embodiment of the present invention, the second removal step of the total stripper recycling comprises transporting the high-boiling-point waste photoresist stripper without the low-boiling-point impurities to a distillation tower of a second distillation device, and then performing rapid heating to a temperature equal to or higher than a boiling point of a component having the highest boiling point among stripper solvent components; performing second distillation by maintaining a temperature of a reboiler connected to the distillation tower of the second distillation device to 160° C. or less; condensing the stripper solvent composition extracted from a top of the distillation tower through second distillation, using a condenser so as to be recovered and simultaneously concentrating, as a waste byproduct, the high-boiling-point impurities other than the stripper solvent composition, in a bottom of the tower and the reboiler, and removing them; and reducing an inner pressure of the distillation tower of the second distillation device to prevent promotion of thermal decomposition of the high-boiling-point stripper solvent.

In an exemplary embodiment of the present invention, the third removal step of the total stripper recycling comprises transporting the stripper solvent composition obtained in the second removal step to a distillation tower of a third distillation device, and performing third distillation under a condition of a temperature of the reboiler being set to 120° C. or less; reducing an inner pressure of the distillation tower of the third distillation device to prevent promotion of thermal decomposition of the high-boiling-point stripper solvent; condensing trace water and volatiles removed by third distillation, using a condenser, and then re-circulating them to the first distillation device; and passing the stripper solvent, which is a high-purity recycled stripper mixture satisfying high-purity electronic grade quality standard by removal of the trace water, through a 1-micron filter, and then transporting it to a storage tank.

In an exemplary embodiment of the present invention, the additional stripper recycling comprises transporting the high-boiling-point residue including the high-boiling-point impurities removed by the second removal step of the total stripper recycling, to a distillation tower of a fourth distillation device; reducing an inner pressure of the distillation tower of the fourth distillation device to prevent promotion of thermal decomposition of the stripper solvent contained in the high-boiling-point residue; performing fourth distillation by maintaining a temperature of a reboiler connected to the distillation tower of the fourth distillation device to a temperature of 160° C. or less; refluxing the high-boiling-point stripper solvent condensed by the condenser after having been volatilized from the waste byproduct in the distillation tower of the fourth distillation device, to a top of the distillation tower of the fourth distillation device until it satisfies high-purity electronic grade quality standard; and recovering the high-boiling-point stripper solvent satisfying the standard, passing it through the 1-micron filter, and transporting it to a storage tank.

In particular, the fourth distillation of the additional stripper recycling may be optimally controlled so as to maximally retard deposition of the photoresist resin while monitoring an extent of viscosification of the high-boiling-point stripper solvent contained in the high-boiling-point residue.

More preferably, when viscosity of the high-boiling-point stripper solvent does not exceed a maximum threshold viscosity, the waste byproduct is circulated to an upside of the reboiler of the fourth distillation device so as to make a predetermined flow in the reboiler, thereby maximally retarding a deposition time of the photoresist resin; in contrast, when the viscosity of the high-boiling-point stripper solvent exceeds a maximum threshold viscosity, a flow rate of the waste byproduct fed to the reboiler is increased, thereby lowering the viscosity of the high-boiling-point stripper solvent.

In an exemplary embodiment of the present invention, the separate stripper recycling comprises transporting the stripper solvent composition recovered through the second removal step using the second distillation device and the high-boiling-point stripper solvent recovered through the additional stripper recycling, to a fifth distillation device; separately recovering individual high-purity electronic grade recycled stripper solvents depending on the boiling point of each stripper solvent of the stripper solvent composition by increasing a number of theoretical plates of a distillation tower of the fifth distillation device while a spiral stirring type column device of the fifth distillation device is rotated at 2,500 rpm at maximum; and passing the recovered individual recycled stripper solvents through the 1-micron filter, and respectively transporting them to individual stripper solvent storage tanks.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
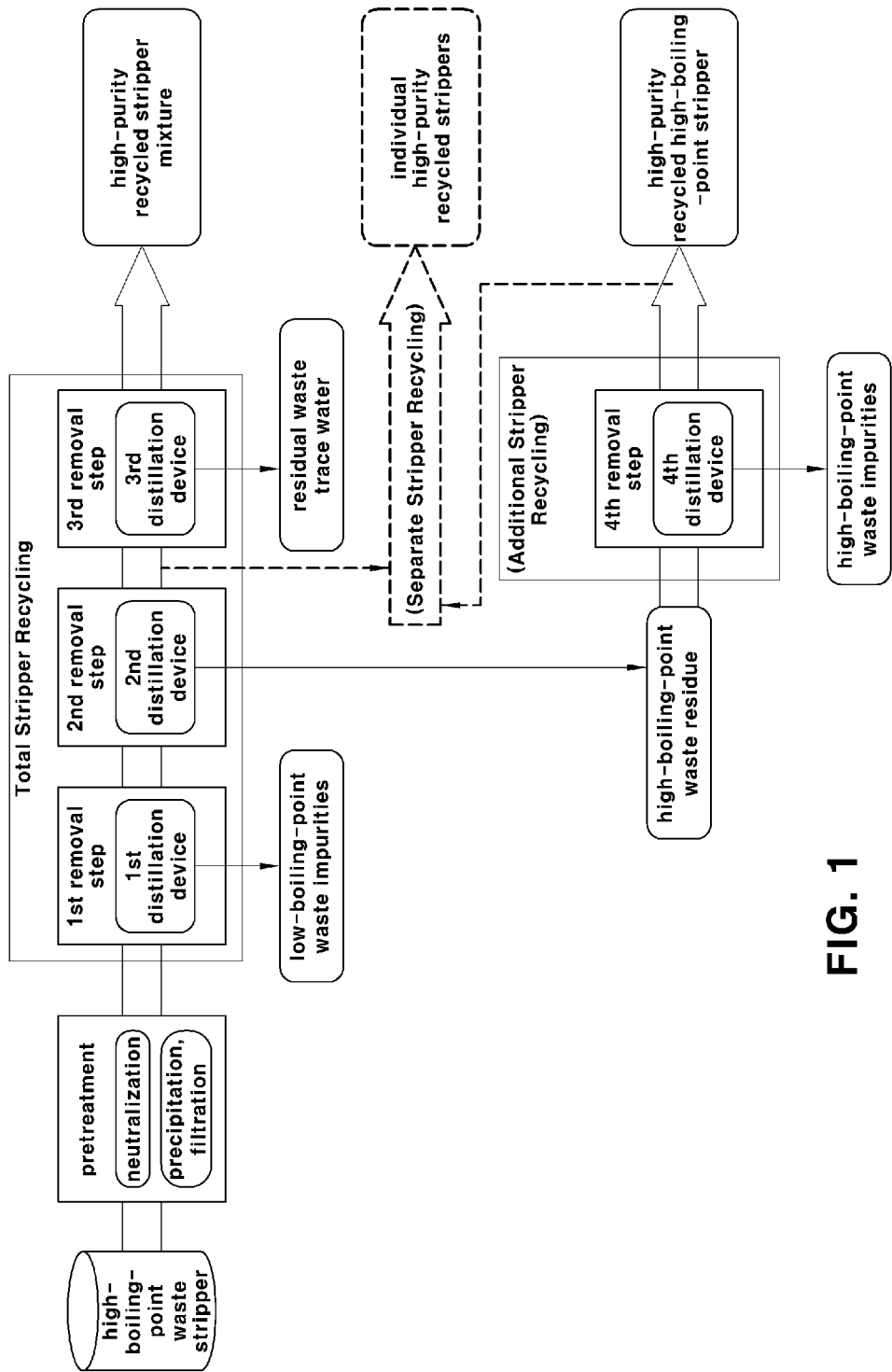
FIG. 1 illustrates a process of recycling a high-boiling-point waste photoresist stripper according to the present invention.

Hereinafter, a detailed description will be given of the present invention.

As used herein, the term "low-boiling-point impurities" refers to impurities having a boiling point lower than the boiling points of individual stripper solvents contained in a high-boiling-point waste photoresist stripper, and typically indicates water such as cleaning wastewater or a small amount of organic solvent such as IPA as a waste solvent.

Also as used herein, the term "high-boiling-point impurities" refers to impurities having a boiling point higher than the boiling points of individual stripper solvents contained in a high-boiling-point waste photoresist stripper, and preferably indicates impurities having a boiling point of 235° C. or more, typically for example, a photoresist resin stripped after having been used for forming a resist pattern in a gate process of a transistor, including other impurities such as a small amount of nonionic surfactant, etc.

Also as used herein, the term "high-purity electronic grade stripper solvent" means that a stripper solvent exhibits quality standard equivalent to that of a new solvent used to prepare an undiluted photoresist stripper, for example, a purity of 99.5% or more, a water content of 0.1% or less and a heavy metal or total metal content at the level of ppb, wherein the lower limit of the water content is not particularly set but is typically about 0.001%, and the total metal content is preferably 500 ppb or less, and the lower limit thereof is not particularly limited but approximates to 1 ppb.

Also as used herein, the term "high-boiling-point stripper solvent" refers to a stripper solvent having a boiling point higher by at least 10° C. than about 220° C. corresponding to the upper limit of the boiling point of a general stripper solvent contained in a high-boiling-point waste photoresist stripper, and is preferably a photoresist stripper solvent having a boiling point of 235° C. or more for use in a stripping process. It is typically exemplified by HEP having high stripper solubility as an organic amine solvent.

To aid understanding of the present invention, a waste photoresist stripper containing a high-boiling-point stripper solvent, etc. is described below.

The recyclable stripper solvent in the waste photoresist stripper, which may be recovered by the recycling method according to the present invention, is an organic solvent mixture comprising a protic solvent, an aprotic solvent and a water-soluble organic amine solvent, and the organic amine solvent is 1-piperazineethanol (hereinafter referred to as "HEP") which is a typical resource of a high-boiling-point stripper solvent.

HEP which is a typical valuable resource of a high-boiling-point stripper solvent as the water-soluble organic amine solvent may be contained in an amount of 15~40 parts by weight based on 100 parts by weight of the high-boiling-point waste photoresist stripper.

HEP which is a high-boiling-point stripper solvent has high hygroscopicity and a water content of 0.1% or less and is thus difficult to purify, and also has high heat sensitivity due to high-boiling-point properties and thus causes thermal decomposition and color change.

Such thermal decomposition and color change may occur under conditions of a temperature of 85° C. or more with a water content of at least 3~5 parts by weight in the waste photoresist stripper, a temperature of 200° C. or more with an HEP content of at most 10~15 parts by weight regardless of the water content, or a temperature of 160° C. or more with an HEP content of at least 10~15 parts by weight.

The organic amine solvent functions to infiltrate the polymeric structure of a photoresist (PR) which is denatured or crosslinked in various courses of etching, painting, ion implantation, etc. in the stripping process to thus destruct intramolecular or intermolecular attraction, and thereby the photoresist is dissolved and easily removed.

Another high-boiling-point property of HEP which is a high-boiling-point stripper solvent may be exemplified by viscosification. When this solvent is in an amount equal to or higher than a predetermined weight ratio based on the relative weight ratio with the photoresist resin of the waste photoresist stripper, it may trigger solidification of the photoresist resin and thus may move up the deposition time while gradually increasing the viscosity thereof. Particularly, viscosification may drastically accelerate in the temperature range of 160° C. or more, undesirably incurring processing difficulties which impede the process of recycling the high-boiling-point stripper solvent from the waste stripper. For this reason, a large amount of HEP in the waste stripper may be removed and discarded as a residue together with the high-boiling-point impurities.

In the recyclable stripper solvent of the waste photoresist stripper, the protic solvent (a protonic glycol ether compound) includes diethyleneglycol monomethyl ether (hereinafter referred to as "MDG"), diethyleneglycol monobutyl ether (hereinafter referred to as "BDG"), or diethyleneglycol monoethyl ether (hereinafter referred to as "EDG"), and MDG, BDG or EDG may be used alone or in combination.

The protic solvent is a compound having high vapor pressure and is less lost by heating or evaporation. It is responsible for increasing solubility of the photoresist and dissolving the photoresist stripped by an alkaline compound so that hydroxide ions generated from the alkaline compound may effectively infiltrate a space between the photoresist and the glass substrate in a stripping process to thus execute dissolution and stripping functions. Furthermore, it is maximized in wettability because of low interfacial tension to thus prevent reattachment of the photoresist which mainly takes place in a cleaning process, thereby maximizing stripping efficiency.

In the recyclable stripper solvent of the waste photoresist stripper, the aprotic solvent (a non-protonic polar compound) includes dimethyl acetamide (hereinafter referred to as "DMAc"), N-methylpyrrolidone (hereinafter referred to as "NMP") or dimethylsulfoxide (hereinafter referred to as "DMSO"), and DMAc, NMP or DMSO may be used alone or in combination.

The aprotic solvent has high solubility of a photoresist in the stripping process, and thus functions to dissolve the photoresist stripped by the amine compound, thereby preventing reattachment of the photoresist which mainly takes place in the cleaning process and maximizing the cleaning effects.

The system for recycling the high-boiling-point waste photoresist stripper according to an exemplary embodiment of the present invention is specified below with reference to the appended drawings.

Figure 2:
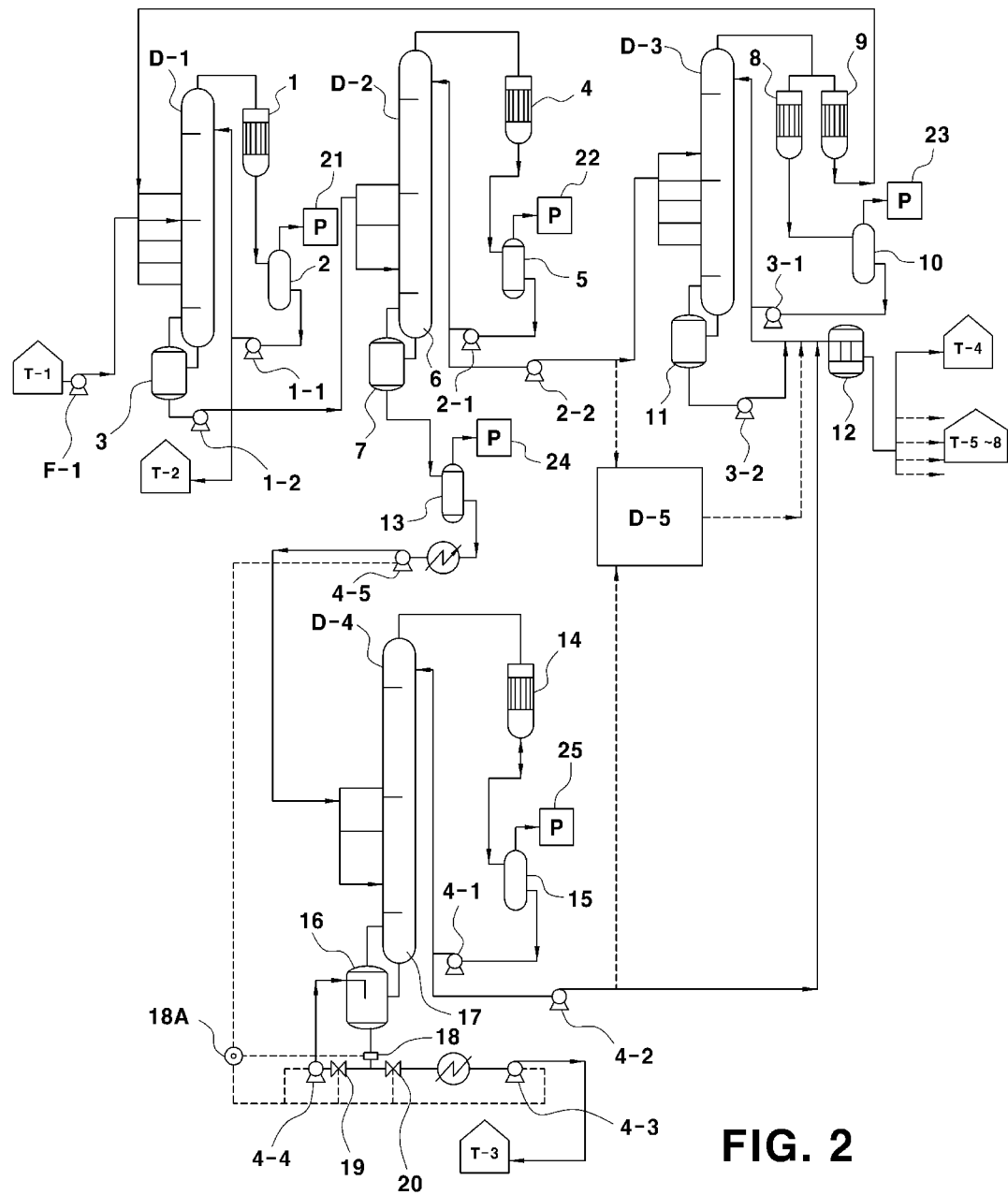
FIG. 2 illustrates a system for implementing the process of recycling a high-boiling-point waste photoresist stripper according to the present invention.

FIG. 1 is a flowchart illustrating the process of highly recovering a high-purity electronic grade high-boiling-point stripper solvent from a high-boiling-point waste photoresist stripper according to an embodiment of the present invention, and FIG. 2 is a view illustrating the system for recycling the high-boiling-point waste photoresist stripper according to the present invention.

As illustrated in FIG. 1, the method of recycling the high-boiling-point waste photoresist stripper according to the present invention includes a pretreatment process, total and additional stripper recycling processes including impurity removal steps, and recovery processes of stripper solvent and additional high-boiling-point stripper solvent. Among these, the pretreatment process may be optionally performed or not depending on the pH of the high-boiling-point waste photoresist stripper including the high-boiling-point stripper solvent, and the kinds and amounts of insoluble materials or impurities.

Furthermore, the total and additional stripper recycling processes including impurity removal steps, and the recovery processes of stripper solvent and additional high-boiling-point stripper solvent are not temporally spatially separated from each other, but are a series of unit operations in which recovering the stripper solvent or the additional high-boiling-point stripper solvent is carried out in coincidence with removing the impurities.

The high-boiling-point waste photoresist stripper is collected, mixed in a separate waste stripper storage tank, fed to a pretreatment unit so as to undergo neutralization, precipitation and filtration. By such a pretreatment process, solids, insoluble denatured photoresist and organic acid components are removed from the high-boiling-point waste stripper.

In the pretreatment process, neutralization is performed to remove a denatured organic acid component which is contained in the high-boiling-point waste stripper by being incorporated in an etching process or a developing process during fabrication of a semiconductor wafer or TFT-LCD. When the pH of the waste stripper is 4~6 due to the presence of the organic acid component, the transport lines of the subsequent total and additional stripper recycling processes or the distillation equipment may corrode, thus remarkably lowering recycling separation efficiency and instability of the recycling process. Hence, neutralization in the pretreatment process enables the organic acid component to be removed so that the pH of the waste stripper is preferably maintained in the range of 6.5~8.5.

In the pretreatment process, subsequent precipitation and filtration are performed to remove not only the neutralized product but also the floating and insoluble components (mainly comprising decomposition residue of the polymer of the photoresist and heavy metal components generated in the conductive metal film etching process) generated in the stripping process. Precipitation is implemented for a period of time enough to induce precipitation of the high-boiling-point waste stripper in the storage tank, for example, 1~12 hr, and preferably 2~5 hr, and then filtration is primarily conducted using a 20~100 µm sieve and then secondarily performed using a 0.1~10 µm sieve, thereby separating the precipitate and the waste stripper from each other.

Preferably, in the pretreatment process, filtration is primarily performed using a 325 mesh (about 44 µm) sieve and then secondarily conducted using a filter having a pore size of 1 µm.

After the pretreatment process as above, the total stripper recycling for removing impurities from the high-boiling-point waste photoresist stripper through three steps is implemented.

The total stripper recycling includes a total of three impurity removal steps including a first removal step for removing low-boiling-point impurities (low-boiling-point waste impurities) such as water, etc. from the high-boiling-point waste photoresist stripper, a second removal step for removing a high-boiling-point residue (high-boiling-point waste impurities) including high-boiling-point impurities such as a photoresist resin, etc., and a third removal step for continuously removing trace water (residual waste trace water).

The system for recycling the high-boiling-point waste photoresist stripper according to the present invention includes a first distillation device for the first removal step (for removing the low-boiling-point impurities such as water, etc. from the high-boiling-point waste photoresist stripper), a second distillation device for the second removal step (for removing the high-boiling-point residue including high-boiling-point impurities such as a photoresist resin, etc.), and a third distillation device for the third removal step (for continuously removing trace water).

In the system for recycling the high-boiling-point waste photoresist stripper according to the present invention, construction of the first distillation device for use in the first removal step of the total stripper recycling is as follows.

The first distillation device is used to remove low-boiling-point impurities such as water, etc. from the high-boiling-point waste photoresist stripper, and includes a feed tank T-1 for storing the pretreated high-boiling-point waste photoresist stripper, a first transport pump F-1 for transporting the high-boiling-point waste stripper from the feed tank T-1 to a distillation tower D-1, and a distillation tower D-1 having 15~25 and preferably about 20 theoretical plates for purification.

The distillation tower D-1 of the first distillation device is responsible for a heating function to a temperature equal to or higher than the boiling point of water so as to enable evaporation of the low-boiling-point impurities such as water, etc. contained in the transported waste stripper, and a reboiler 3 as a heater therefor is separately connected to the bottom of the distillation tower D-1.

In order to prevent promotion of thermal decomposition when the high-boiling-point waste stripper in the distillation tower D-1 is heated, a vacuum pump 21 is connected to the top of a temporary storage tank 2 for temporarily storing the stripper solvent, with a condenser 1 and the temporary storage tank 2 being sequentially connected to the top of the distillation tower D-1.

With the goal of preventing promotion of thermal decomposition of the high-boiling-point waste stripper, the vacuum pump 21 is actuated to thus reduce the inner pressure of the distillation tower D-1 so that vacuum operation is carried out. Preferably, the pressure for vacuum distillation is set to 110 torr or less and the temperature of the reboiler 3 is set to 80° C. or less.

While maintaining such purification conditions, low-boiling-point impurities such as water, IPA, etc. are distilled and extracted from the top of the distillation tower, and the extracted low-boiling-point impurities are condensed by the condenser 1 connected to the top of the distillation tower D-1 and then recovered in the temporary storage tank 2, and the recovered low-boiling-point impurities are transported to a separate collection tank T-2 by the actuation of a second transport pump 1-1, and then discarded.

Based on the construction of the first distillation device, removing the low-boiling-point impurities from the high-boiling-point waste photoresist stripper is specified below.

During the total stripper recycling, the first removal step for removing the low-boiling-point impurities from the high-boiling-point waste photoresist stripper is performed by primarily distilling the high-boiling-point waste photoresist stripper under conditions of the temperature of the reboiler being set to 85° C. or less, thereby easily removing the low-boiling-point impurities.

As illustrated in FIG. 2, the high-boiling-point waste photoresist stripper is fed to the feed tank T-1, and then transported to the distillation tower D-1 of the first distillation device, having 15~25 and preferably about 20 theoretical plates for purification, by the actuation of the first transport pump F-1.

Subsequently, the waste stripper transported to the distillation tower D-1 of the first distillation device is heated to a temperature equal to or higher than the boiling point of water by means of the reboiler 3 so as to enable evaporation of the low-boiling-point impurities such as water, etc.

The stripper solvent components contained in the waste stripper should not be susceptible to changes in physicochemical properties including decomposition or deformation when exposed at high temperature for a long period of time. Especially, HEP which is a high-boiling-point stripper solvent may be promoted in thermal decomposition due to thermal damage when the temperature is 85° C. or more under conditions of the water content in the waste stripper being at least 3~5 wt % with high heat sensitivity because of the high-boiling-point properties.

To prevent promotion of thermal decomposition, the vacuum pump 21 connected to the distillation tower D-1 is actuated to thus reduce the inner pressure of the tower so as to carry out vacuum operation. Preferably, the pressure for vacuum distillation is set to 110 torr or less, and the temperature of the reboiler 3 is set to 80° C. or less.

Under such purification conditions, the low-boiling-point impurities such as water, IPA, etc. are distilled and extracted from the top of the distillation tower, and the extracted low-boiling-point impurities are condensed by the condenser 1, recovered in the temporary storage tank 2, transported to the separate collection tank T-2 by the actuation of the second transport pump 1-1, and then discarded.

Also in the system for recycling the high-boiling-point waste photoresist stripper according to the present invention, construction of the second distillation device for use in the second removal step of the total stripper recycling is as follows.

The second distillation device plays a role in removing the high-boiling-point residue including the high-boiling-point impurities from the waste stripper after the first removal step, and simultaneously in recycling the stripper solvent composition.

The second distillation device includes a distillation tower D-2 having 7~15 and preferably about 10 theoretical plates for purification, to which the waste stripper after the first removal step is discharged from the reboiler 3 of the first distillation device by the actuation of a third transport pump 1-2; a reboiler 7 and a vacuum pump 22 connected to the distillation tower D-2 to prevent changes in physicochemical properties, including decomposition or deformation by heat, of the stripper solvent component (especially, HEP which is a high-boiling-point stripper solvent sensitive in thermal damage due to high-boiling-point properties) contained in the waste stripper in the distillation tower D-2; a condenser 4 for condensing the total stripper solvent composition extracted from the waste stripper; and a temporary storage tank 5 for temporarily storing the stripper solvent composition recovered after having been condensed by the condenser 4.

The distillation tower D-2 of the second distillation device is responsible for removing the high-boiling-point residue including the high-boiling-point impurities from the waste stripper after the first removal step and simultaneously for heating and distilling the waste stripper after the first removal step so as to recycle the stripper solvent composition, and the reboiler 7 as a heater therefor is separately connected to the bottom of the distillation tower D-2.

The vacuum pump 22 is connected to the top of the temporary storage tank 5 for temporarily storing the stripper solvent, with the condenser 4 and the temporary storage tank 5 being sequentially connected to the top of the distillation tower D-2.

Also, connected to the outlet of the temporary storage tank 5 are a fifth transport pump 2-1 and a sixth transport pump 2-2, which are reflux pumps for transporting, to a third distillation device, the stripper solvent composition condensed by the condenser 4 of the second distillation device and recovered in the temporary storage tank 5.

The high-boiling-point impurities removed from the waste stripper are concentrated and left behind in the bottom 6 of the tower and the reboiler 7 to the extent of not deposited through solidification.

Based on the construction of the second distillation device, removing the high-boiling-point impurities from the high-boiling-point waste photoresist stripper is specified below.

During the total stripper recycling, the second removal step for removing the high-boiling-point impurities from the high-boiling-point waste photoresist stripper without the low-boiling-point impurities is performed through second distillation under conditions of the temperature of the reboiler being set to 160° C. or less, thereby removing the high-boiling-point residue including the high-boiling-point impurities and simultaneously recycling the stripper solvent.

When the high-boiling-point waste photoresist stripper without the low-boiling-point impurities has a water content of 1~3 wt %, it is transported to the distillation tower D-2 of the second distillation device, having 7~15 and preferably about 10 theoretical plates for purification, via the reboiler 3 by the actuation of the third transport pump 1-2.

The stripper solvent component contained in the waste stripper in the distillation tower D-2 of the second distillation device, especially HEP which is a high-boiling-point stripper solvent sensitive to thermal damage due to high-boiling-point properties, has to prevent changes in physicochemical properties including decomposition or deformation by heat at high temperature.

Because thermal decomposition and color change occur prominently under conditions of a temperature of 200° C. or more when the amount of HEP is equal to or less than 10~15 wt % regardless of the water content or under conditions of a temperature of 160° C. or more when the amount of HEP is equal to or more than 10~15 wt %, they may be prevented by actuating the vacuum pump 22 connected to the distillation tower to thus reduce the inner pressure of the tower so that vacuum operation is carried out. Preferably, the pressure for vacuum distillation is set to 90 torr or less, and the temperature of the reboiler 7 is set to 160° C. or less.

In order to remove the high-boiling-point impurities from the high-boiling-point waste photoresist stripper transported to the distillation tower D-2 of the second distillation device, rapid heating is conducted to a temperature equal to or higher than the boiling point of the component having the highest boiling point among stripper solvent components, and thereby the total stripper solvent composition (high-purity recyclable stripper mixture) constituting the stripper is distilled and extracted at the same time from the top of the distillation tower, and the extracted total stripper solvent composition is sent to the condenser 4 so as to be condensed and thus separated.

Simultaneously, the high-boiling-point impurities such as a photoresist resin, etc. which are dissolved in the waste stripper are concentrated and left behind in the bottom 6 of the tower and the reboiler 7 to the extent of not being deposited through solidification.

When HEP which is a high-boiling-point stripper solvent, having viscosification as another high-boiling-point property, is in an amount equal to or higher than a predetermined weight ratio based on the relative weight ratio with the photoresist resin of the waste stripper, it may trigger solidification of the photoresist resin and thus may move up the deposition time while gradually increasing the viscosity thereof.

In particular, viscosification may drastically accelerate in the temperature range of 160° C. or more, and may cause recycling difficulties. To prevent this, a large amount of HEP in the waste stripper is not recovered in the condenser 4 by distillation and extraction, but may be left behind as the residue in the bottom 6 of the tower and the reboiler 7 together with the high-boiling-point impurities, and then removed and discarded as a waste byproduct.

Hence, in the present invention, the waste byproduct comprising the residue (including HEP) left behind in the bottom 6 of the tower and the reboiler 7 together with the high-boiling-point impurities is subjected to additional stripper recycling using a fourth distillation device to thus additionally recover HEP.

The waste byproduct comprising the high-boiling-point impurities and HEP which is a high-boiling-point stripper solvent mixed in a considerable amount is transported to a temporary storage tank 13 connected to the fourth distillation device so as for additional stripper recycling, and the fourth distillation device for additional secondary recycling is described in detail later.

In the system for recycling the high-boiling-point waste photoresist stripper according to the present invention, construction of the third distillation device for use in the third removal step of the total stripper recycling is as follows.

The third distillation device is used to remove trace water which finely remains due to hygroscopicity of the stripper solvent component from the stripper solvent composition obtained by the second distillation device, and includes a distillation tower D-3 which receives the stripper solvent composition which is discharged by the actuation of the fifth transport pump 2-1 and the sixth transport pump 2-2 after having been condensed by the condenser 4 of the second distillation device and recovered in the temporary storage tank 5.

The distillation tower D-3 of the third distillation device has 25~35 and preferably about 30 theoretical plates for purification.

Furthermore, the third distillation device includes a reboiler 11 and a vacuum pump 23 connected to the distillation tower D-3 to prevent changes in physicochemical properties, including decomposition or deformation by heat, of the stripper solvent component (especially, HEP which is a high-boiling-point stripper solvent sensitive to thermal damage due to high-boiling-point properties) contained in the waste stripper in the distillation tower D-3.

The reboiler 11 is separately connected to the bottom of the distillation tower D-3 of the third distillation device and thus performs a heating function so as to remove trace water from the stripper solvent composition obtained by the second distillation device.

The vacuum pump 23 is connected to the top of a temporary storage tank 10 for temporarily storing the stripper solvent, with condensers 8, 9 and the temporary storage tank 10 being sequentially connected to the top of the distillation tower D-3, in order to prevent promotion of thermal decomposition when the stripper solvent composition in the distillation tower D-3 is heated.

The third distillation device includes the condenser 9 connected to the top of the distillation tower D-3 so as to condense the removed trace water and volatiles, the temporary storage tank 10 for temporarily storing the condensed stripper solvent, and an eighth transport pump 3-2 for finally transporting the stripper solvent in the temporary storage tank 10 and the remaining stripper solvent in the bottom of the distillation tower D-3 and the reboiler 11, to a recycled stripper mixture storage tank T-4.

A 1-micron filter 12 for finally filtering the stripper solvent is disposed in the flow path from the eighth transport pump 3-2 to the recycled stripper mixture storage tank T-4.

Based on the construction of the third distillation device, removing trace water from the stripper solvent composition without the high-boiling-point impurities is described in more detail below.

The third removal step of the total stripper recycling is performed by subjecting the stripper solvent composition to third distillation under conditions of the temperature of the reboiler being set to 110° C. or less, thereby removing trace water, ultimately obtaining a high-purity recycled stripper solvent (a high-purity recycled stripper mixture) containing a portion of the recycled high-boiling-point stripper solvent.

The third distillation device is used to remove trace water which finely remains due to hygroscopicity of the stripper solvent from the stripper solvent composition obtained by the second distillation device, and is operated in such a way that the stripper solvent composition condensed by the condenser 4 and recovered in the temporary storage tank 5 is transported to the distillation tower D-3 of the third distillation device, having 25~35 and preferably about 30 theoretical plates for purification, by the actuation of the fifth transport pump 2-1 and the sixth transport pump 2-2 which are reflux pumps.

Subsequently, the third distillation device performs a process of finally recycling a high-purity electronic grade recycled stripper solvent containing a portion of the recycled high-boiling-point stripper solvent having a water content of 0.1 wt % or less by removing the residual trace water from the stripper solvent composition recovered by the second distillation device.

The stripper solvent component contained in the waste stripper in the third distillation device, especially HEP which is a high-boiling-point stripper solvent sensitive to thermal damage due to high-boiling-point properties, has to prevent changes in physicochemical properties including decomposition or deformation by heat at high temperature.

Thermal decomposition and color change may become prominent under conditions of a temperature of 200° C. or more when the amount of HEP is equal to or less than 10~15 wt % regardless of the water content, and such thermal damage may be triggered gradually from 120° C. To prevent this, the vacuum pump 23 connected to the distillation tower is actuated to thus reduce the inner pressure of the tower so that vacuum operation is carried out. Preferably, the pressure for vacuum distillation is set to 110 torr or less, and the temperature of the reboiler 11 is set to 110° C. or less.

Subsequently, in order to remove trace water, which was maximally removed by the first distillation device but left behind to the level of 1~3 wt %, from the stripper solvent composition transported to the distillation tower D-3 of the third distillation device, the residual water absorbed to the stripper solvent composition is removed through the distillation tower having about 30 theoretical plates with high separation efficiency, after which the water content is maintained at 0.1% or less, and generally in the range of 0.001~0.1%.

The removed trace water and volatiles are condensed by the condenser 9 and then re-circulated back to the first distillation device to thus be distilled, and thereby the water is transported to the separate collection tank T-2 and then discarded, and part of the stripper solvent contained in the volatiles is sent again to the second distillation device and thus recovered without loss.

Part of the stripper solvent, which is recovered in the temporary storage tank 10 after having been volatilized from the top of the tower and then condensed by the condenser 8, is refluxed to the top of the tower until it satisfies high-purity electronic grade quality standard (purity: 99.5% or more, water content: 0.1% or less, total metal content: 100 ppb or less) by the actuation of a seventh transport pump 3-1.

Thereafter, the stripper solvent satisfying the above standard is recovered together with the stripper solvent left behind in the bottom of the tower and the reboiler 11, by the actuation of the eighth transport pump 3-2, and then passes through the 1-micron filter 12 positioned in the recovery path, thereby obtaining a recycled stripper solvent composition satisfying the high-purity electronic grade quality standard, which is then immediately transported to the recycled stripper mixture storage tank T-4 and stored therein.

When the total stripper recycling including the three impurity removal steps is carried out in this way, the stripper solvent composition (high-purity recycled stripper mixture) in the high-boiling-point waste photoresist stripper may be recovered at high purity at the same time.

Below is a description of additional stripper recycling for additionally recovering the high-boiling-point stripper solvent from the high-boiling-point residue of the high-boiling-point waste photoresist stripper removed by the second removal step of the total stripper recycling.

The system for recycling the high-boiling-point waste photoresist stripper according to the present invention includes a fourth distillation device for further obtaining a stripper solvent (HEP) by additionally recycling the waste byproduct comprising the high-boiling-point impurities and the high-boiling-point residue (including HEP) left behind in the bottom 6 of the tower of the second distillation device and the reboiler 7.

A temporary storage tank 13 for temporarily storing the waste byproduct and a ninth transport pump 4-5 for sending the waste byproduct to the distillation tower D-4 are disposed between the reboiler 7 separately connected to the bottom 6 of the tower of the second distillation device and the distillation tower D-4 of the fourth distillation device.

The distillation tower D-4 of the fourth distillation device has 8~12 and preferably about 10 theoretical plates for purification.

The fourth distillation device includes a vacuum pump 25 for reducing the inner pressure of the tower and a reboiler 16 for heating and distilling the waste byproduct, which are respectively connected to the top and the bottom of the distillation tower D-4, in order to enable the waste byproduct transported to the distillation tower D-4, especially the high-boiling-point stripper solvent sensitive to thermal damage due to its high-boiling-point properties to prevent changes in physicochemical properties including decomposition or deformation by heat.

Also, the fourth distillation device includes a condenser 14 for condensing the stripper solvent volatilized from the waste byproduct in the distillation tower D-4, and a temporary storage tank 15 for recovering and temporarily storing the condensed stripper solvent.

Also, the fourth distillation device further includes control members for monitoring the extent of viscosification of the high-boiling-point stripper solvent contained in the high-boiling-point residue and maximally increasing the recycling yield of HEP while maximally retarding the deposition of the photoresist resin, when the photoresist resin which is not sufficiently concentrated, of the waste byproduct in the reboiler 16, is transported to the impurity collection tank T-3 and discarded.

Specifically, in the fourth distillation device, a viscometer 18 for measuring the viscosity of the residue and a flow rate meter for controlling the flow rate in the reboiler 16 are disposed in the connection line between the reboiler 16 and the collection tank T-3, and are controlled by a controller 18*a*.

More specifically, of the flow rate meter, a first flow rate control valve 19 is disposed together with a tenth transport pump 4-4 in the circulation line upwards from the outlet of the reboiler 16, and a second flow rate control valve 20 is disposed together with an eleventh transport pump 4-3 in the connection line between the outlet of the reboiler 16 and the collection tank T-3.

The fourth distillation device includes a twelfth transport pump 4-1 and a thirteenth transport pump 4-2 connected to the outlet of the temporary storage tank 15 so as to transport the finally recovered stripper solvent satisfying the above standard, that is, HEP, to the recycled stripper mixture storage tank T-4, and a 1-micron filter 12 for finally filtering the transported stripper solvent.

Based on the construction of the fourth distillation device, additional stripping recycling for additionally recovering the high-boiling-point stripper solvent from the high-boiling-point residue of the high-boiling-point waste stripper is described below.

The additional stripper recycling includes supplying the high-boiling-point waste residue including the high-boiling-point impurities removed by the second distillation device, to the fourth distillation device, and removing the high-boiling-point impurities (high-boiling-point waste impurities) from the high-boiling-point waste residue including the high-boiling-point impurities through the fourth removal step using the fourth distillation device and simultaneously extracting and recovering the high-purity electronic grade high-boiling-point stripper solvent due to the removal of the high-boiling-point impurities.

Preferably, the additional stripper recycling is carried out through fourth distillation under conditions in which the high-boiling-point residue including the high-boiling-point impurities removed by second distillation of the total stripper recycling is maintained at 160° C. or less in the reboiler and under conditions of optimally controlling the extent of viscosification of the high-boiling-point stripper solvent contained in the high-boiling-point residue so as to maximally retard the deposition of the photoresist resin. Thereby, only the high-purity high-boiling-point stripper solvent may be additionally recycled in coincidence with removing the high-boiling-point impurities.

The waste byproduct comprising the high-boiling-point impurities and HEP which is a high-boiling-point stripper solvent mixed in a considerable amount is transported to the temporary storage tank 13 connected to the fourth distillation device for additional stripper recycling.

As illustrated in FIG. 2, the high-boiling-point waste photoresist stripper from which the low-boiling-point impurities were primarily removed is sent to the second distillation device D-2, after which it is extracted in the form of the stripper solvent composition and simultaneously part of the high-boiling-point stripper solvent which was not recovered by extraction is left behind as the waste byproduct in the bottom 6 of the tower and the reboiler 7 together with the high-boiling-point impurities. The waste byproduct is sent to the temporary storage tank 13 connected with the fourth distillation device for additional stripper recycling.

Subsequently, the ninth transport pump 4-5 is actuated so that the waste byproduct is transported to the distillation tower D-4 of the fourth distillation device having 8~12 and preferably about 10 theoretical plates for purification.

The waste byproduct transported to the distillation tower D-4 of the fourth distillation device contains HEP which is a high-boiling-point stripper solvent sensitive to thermal damage due to high-boiling-point properties. Because such a high-boiling-point stripper solvent suffers from changes in physicochemical properties including decomposition or deformation by heat at high temperature, such changes have to be prevented.

Also, thermal decomposition and color changes may occur prominently under conditions of a temperature of 160° C. or more when the amount of HEP is equal to or more than 10~15 wt % regardless of the water content, and thus have to be prevented.

Hence, the vacuum pump 25 connected to the distillation tower D-4 of the fourth distillation device is actuated to thus reduce the inner pressure of the tower, and thereby vacuum operation is carried out. Preferably, the pressure for vacuum distillation is set to 80 torr or less, and the temperature of the reboiler 16 is set to 160° C. or less.

When HEP which is a high-boiling-point stripper solvent, having viscosification as the high-boiling-point property, is in an amount equal to or higher than a predetermined weight ratio based on the relative weight ratio with the photoresist resin in the waste stripper, it may trigger solidification of the photoresist resin and may move up the deposition time while gradually increasing the viscosity thereof.

Particularly, viscosification may drastically accelerate in the temperature range of 160° C. or more. In the case where the waste byproduct is purified through a conventional recycling method, the photoresist resin is deposited and solidified in the bottom 17 of the tower and the reboiler 16, thereby breaking the gas-liquid equilibrium of the distillation line based on the material resin, decreasing the recycling efficiency and lowering the distillation recovery efficiency, resulting in inefficient distillation operation.

Also, when the photoresist resin, which is not sufficiently concentrated, of the waste byproduct in the reboiler 16, is transported to the impurity collection tank T-3 and discarded, HEP which is a high-boiling-point stripper solvent contained in a large amount in the waste stripper is transported and discarded together, making it difficult to achieve high recycling yield due to an increase in loss of the HEP solvent which is an expensive valuable resource.

Therefore, in the present invention, optimal control is implemented to monitor the extent of viscosification of the high-boiling-point stripper solvent contained in the high-boiling-point residue, and to maximally increase the recycling yield of HEP while maximally retarding the deposition of the photoresist resin.

Specifically, the fourth distillation device includes a viscometer 18 for measuring the viscosity of the residue, a flow rate meter for controlling the flow rate in the reboiler 16, and a controller for integrated control thereof.

Referring to FIG. 2, distillation is carried out in the distillation tower D-4 of the fourth distillation device, and thereby the stripper solvent composition including HEP in the form of a mixture from the waste byproduct is recovered in the temporary storage tank 15 through the condenser 14. While the concentration of HEP of the waste byproduct supplied to the reboiler 16 connected to the distillation tower D-4 gradually increases during the recovery process, the relative weight ratio with the photoresist resin also increases, and thus the viscosity of the HEP solvent is simultaneously increased.

When the viscosity of the HEP solvent is increased, a portion of the waste byproduct including HEP is fed to the viscometer 18 and thus changes in the viscosity of the waste byproduct are measured, so that the deposition time through solidification of the photoresist resin therein may be indirectly measured.

In order to indirectly measure the deposition time through solidification of the photoresist resin using the viscometer 18, a correlation between the deposition time through solidification of the photoresist resin and changes in the viscosity of HEP over time by viscosification depending on changes in the weight ratio of HEP in the waste byproduct is made in advance and utilized.

As the concentration of HEP of the waste byproduct in the reboiler 16 increases, viscosification is considerably progressed due to an increase in the relative weight ratio with the photoresist resin, and thus the photoresist resin begins to be deposited as a solid component while the viscosity of HEP is increased.

The viscosity of HEP measured by the viscometer 18 may be determined to be maximum threshold viscosity at a point of time at which the photoresist resin is deposited as a solid component, and the level of the waste byproduct in the reboiler 16 at the same point of time may be decided as the minimum level which enables additional recycling of HEP.

Thus, in the case where the viscosity of HEP measured by the viscometer 18 does not exceed the maximum threshold viscosity, the first flow rate control valve 19 is opened and the tenth transport pump 4-4 is actuated in response to an output signal by the controller 18*a*, so that the waste byproduct is circulated to the upside of the reboiler 16, thereby making a predetermined flow in the reboiler 16. Accordingly, the point of time at which the photoresist resin is deposited may be maximally retarded tanks to an effect of mitigation of the viscosification.

In contrast, in the case where the viscosity of HEP measured by the viscometer 18 reaches the maximum threshold viscosity, the flow rate of the waste byproduct fed to the reboiler 16 is increased so as to decrease the viscosity of HEP which is maximally viscosified.

The second flow rate control valve 20 is opened and the eleventh transport pump 4-3 is actuated in response to an output signal by the controller 18*a*, whereby a portion of the waste byproduct in which HEP that is a high-boiling-point stripper solvent is maximally viscosified is transported to the separate collection tank T-3.

Simultaneously, the ninth transport pump 4-5 is actuated in response to another output signal by the controller 18*a*, so that the flow rate of the waste byproduct fed to the reboiler 16 is increased, and thereby the level of the waste byproduct in the reboiler 16 may be kept to equal to or higher than the minimum level which enables additional recycling of HEP.

The recycled HEP solvent, which is the high-boiling-point stripper solvent including part of the stripper solvent composition that is recovered in the temporary storage tank 15 after having been volatilized from the waste byproduct in the distillation tower D-4 and then condensed by the condenser 14, is refluxed to the top of the distillation tower D-4 until it satisfies the high-purity electronic grade quality standard (purity: 99.5% or more, water content: 0.1% or less, total metal content: 100 ppb or less) by the actuation of the twelfth transport pump 4-1.

Then, the HEP solvent satisfying the above standard is recovered by the actuation of the twelfth transport pump 4-1 and the thirteenth transport pump 4-2, and then passes through the 1-micron filter 12, and thus finally recovered as the recycled high-boiling-point stripper solvent (high-purity recycled high-boiling-point stripper) satisfying the high-purity electronic grade quality standard. The finally recovered recycled high-boiling-point stripper solvent is immediately transported to the recycled stripper mixture storage tank T-4 and stored therein.

In coincidence with removing the high-boiling-point impurities from the high-boiling-point waste residue including the high-boiling-point impurities, HEP which is a high-purity electronic grade high-boiling-point stripper solvent may be additionally easily recycled.

Consequently, the total stripper recycling and the additional stripper recycling may increase the recycling yield of the high-boiling-point stripper solvent, and enable economical and efficient recycling and recovery of the high-boiling-point stripper solvent which is a high-quality high-purity electronic grade expensive valuable resource alleviated in problems of thermal decomposition and color change.

Meanwhile, separate stripper recycling may be further performed so as to separately recover, as individual high-purity recycled strippers, the total stripper solvent composition (high-purity recycled stripper mixture) from which the high-boiling-point residue including the high-boiling-point impurities was removed through the second removal step using the second distillation device during the total stripper recycling, and the high-boiling-point stripper solvent (high-purity recycled high-boiling-point stripper) recovered through the additional stripper recycling using the fourth distillation device.

Construction of a fifth distillation device for the separate stripper recycling is as follows.

Separate stripper recycling may be optionally or additionally implemented, and enables the stripper solvent composition or the organic solvent mixture such as the high-boiling-point stripper solvent to be separately recovered as individual stripper solvents using the fifth distillation device.

Therefore, adopted as the distillation tower D-5 of the fifth distillation device is a spiral spinning band type distillation tower which includes a spiral stirring type column device made of metal or Teflon therein. As the number of theoretical plates of the tower increases while the spiral stirring type column device is rapidly rotated at 2,500 rpm at maximum, high separation efficiency may result, and a mixture without fine impurities or having a narrowed boiling point width may be individually separated at high purity.

The fifth distillation device includes a 1-micron filter 12 for finally filtering the individual recovered recycled stripper solvents, and individual stripper solvent storage tanks T-5, T-6, T-7, T-8 for storing the filtered stripper solvents.

In order to separately recover, as the individual stripper solvents, the stripper solvent composition or the organic solvent mixture such as the high-boiling-point stripper solvent based on the above construction, the stripper solvent composition recovered through the second removal step using the second distillation device is transported to the distillation tower D-5 of the fifth distillation device by the actuation of the fifth transport pump 2-1 and the sixth transport pump 2-2 which are reflux pumps.

The distillation tower D-5 of the fifth distillation device is a spiral spinning band type distillation tower as mentioned above. By increasing the number of theoretical plates of the tower while the spiral stirring type column device is rapidly rotated at 2,500 rpm at maximum, this tower exhibits high separation efficiency, and enables individual high-purity separation of a mixture without fine impurities or having a narrowed boiling point width.

Specifically, the individual high-purity electronic grade recycled stripper solvents may be sequentially separately recovered depending on the boiling point of each stripper solvent of the stripper solvent composition while trace water left behind in an amount of about 1~3 wt % by being maximally removed from the stripper solvent composition using the first distillation device is additionally removed so as to be in the level of 0.1% or less.

Finally, the individual recovered recycled stripper solvents pass through the 1-micron filter 12 and then are respectively transported to the stripper solvent storage tanks T-5, T-6, T-7, T-8 and stored therein.

The high-boiling-point stripper solvent recovered through the additional stripper recycling, especially the high-boiling-point stripper solvent (e.g. HEP solvent) recovered using the fourth distillation device, is transported to the distillation tower D-5 of the fifth distillation device by the actuation of the twelfth transport pump 4-1 and the thirteenth transport pump 4-2 which are reflux pumps.

Subsequently, as in the principle in which individual recycled stripper solvents are separately recovered from the stripper solvent composition, individual high-purity electronic grade recycled stripper solvents are separately recovered from the high-boiling-point stripper solvent depending on the boiling point, pass through the 1-micron filter 12, and then are transported to the stripper solvent storage tanks T-5, T-6, T-7, T-8 and stored therein.

The high-purity electronic grade stripper solvents and the high-boiling-point stripper solvents, which are recovered through the series of total stripper recycling, additional stripper recycling and separate stripper recycling as above, may be easily reused upon preparation of the stripper solvent composition in all of the stripping processes in a plurality of manufacturers for fabricating semiconductor wafers or TFT-LCD from which waste strippers are discharged.

Below is a description of the example and test examples of the present invention and comparative examples.

EXAMPLE

The high-boiling-point waste photoresist stripper generated in TFT-LCD and semiconductor manufacturing processes was subjected to total stripper recycling using first to third distillation devices, additional stripper recycling using a fourth distillation device, and separate stripper recycling using a fifth distillation device according to the present invention. The composition of the waste stripper used herein is shown in Table 1 below.

TABLE 1

| | Stripper Solvent Components (wt %) | | | | Impurity Components (wt %) | | | |
|---|---|---|---|---|---|---|---|---|
| | DMAc | MDG | NMP | HEP | Photoresist resin | Water | IPA | Others |
| High-boiling-point waste stripper | 14 | 17 | 10 | 31 | 4.5 | 17 | 5 | 1.5 |

Test Example 1

Removing the low-boiling-point impurities from the high-boiling-point waste photoresist stripper including components shown in Table 1, namely, removing the low-boiling-point impurities using a first distillation device (first removal step) in total stripper recycling among stripper recycling processes according to the present invention was performed, after which the amounts of removed water and IPA (Iso Propyl Alcohol) corresponding to the low-boiling-point impurities were measured. The results are shown in Table 2 below.

TABLE 2

| | 1st Removal Step | After 1st Removal Step |
|---|---|---|
| Vacuum Pressure (torr) | 110 | — |
| Reflux Ratio | 5 | — |
| Reboiler Temp. (° C.) | 75 | — |
| Actual Number of Tower Plates | 20 | — |
| Residual IPA content (%) | — | 0.05 |
| Residual Water content (%) | — | 1.9 |

As is apparent from Table 2, after the first removal step of the total stripper recycling, the low-boiling-point impurities such as water, IPA, etc. were extracted and removed from the high-boiling-point waste photoresist stripper.

Test Example 2

After removal of the low-boiling-point impurities (first removal step) in the total stripper recycling, the second removal step for removing the high-boiling-point waste residue from the high-boiling-point waste stripper was performed using a second distillation device, and then the recycling yield of HEP which is a high-boiling-point stripper solvent was measured. The results are shown in Table 3 below.

TABLE 3

| | Total Stripper Recycling | After Total Stripper Recycling |
|---|---|---|
| Vacuum Pressure (torr) | 90 | — |
| Reflux Ratio | 3 | — |
| Reboiler Temp. (° C.) | 146 | — |
| Actual Number of Tower Plates | 10 | — |
| 1st HEP Yield (%, wt) | — | 15 |

As is apparent from Table 3, the high-boiling-point waste residue (high-boiling-point waste impurities) was removed through the second removal step of the total stripper recycling, after which a stripper solvent composition was obtained, and the HEP yield of the composition was 15 wt % or more.

Test Example 3

After removal of the high-boiling-point waste residue (second removal step) of the total stripper recycling, the third removal step for removing trace water from the high-boiling-point waste stripper (the stripper solvent composition) was performed using a third distillation device, after which the residual water content was measured. The results are shown in Table 4 below.

TABLE 4

|  | 2nd Removal Step | After 2nd Removal Step |
| --- | --- | --- |
| Vacuum Pressure (torr) | 110 | — |
| Reflux Ratio | 3 | — |
| Reboiler Temp. (° C.) | 109 | — |
| Actual Number of Tower Plates | 30 | — |
| Residual Water content (%) | — | 0.07 |

As is apparent from Table 4, the residual water was removed from the stripper solvent composition, and thus the water content was 0.07%, which is lower than 0.1%.

Test Example 4

The high-boiling-point waste residue removed from the high-boiling-point waste stripper was subjected to additional stripper recycling using a fourth distillation device, after which the additional recycling yield of HEP which is a high-boiling-point stripper solvent was measured. The results are shown in Table 5 below.

TABLE 5

|  | Additional Stripper Recycling | After Additional Stripper Recycling |
| --- | --- | --- |
| Vacuum Pressure (torr) | 50 | — |
| Reflux Ratio | 2 | — |
| Reboiler Temp. (° C.) | 153 | — |
| Actual Number of Tower plates | 10 | — |
| $2^{nd}$ HEP Yield (%, wt) | — | 27 |

As is apparent from Table 5, the additional recovery efficiency of HEP amounted to 27%, which is evaluated to be almost as twice as 15% which is the first HEP yield. Thus, HEP could be additionally recycled and recovered.

Test Example 5

In order to separate, as individual stripper solvents, the high-purity electronic grade stripper solvent mixture including the recovered HEP which is a high-boiling-point stripper solvent, separate stripper recycling using a fifth distillation device was performed, after which the amounts of finally recovered high-purity electronic grade recycled solvents including HEP were analyzed. The results are shown in Table 6 below.

TABLE 6

|  |  |  |  | Recycled purity (%) | Water content (%) | IPA content (%) | Total Metal content (ppb) |
| --- | --- | --- | --- | --- | --- | --- | --- |
|  | SPCE. |  |  | ≥99.5 | ≤0.1 | ≤0.1 | ≤100 |
| Storage Tank T-4 | Recycled Stripper Solvent Mixture |  |  | ≥99.5 | ≤0.07 | ≤0.05 | ≤100 |
| Storage Tanks T-5~8 | Individual Recycled Stripper Solvents | T5 T6 T7 T8 | DMAc MDG NMP HEP | ≥99.5 | ≤0.07 | ≤0.05 | ≤100 |

As is apparent from Table 6, the recycled stripper solvent mixture could be easily separately recovered as individual high-purity electronic grade recycled stripper solvents (DMAc, MDG, NMP, and HEP).

According to the present invention, the high-boiling-point recycled stripper (the stripper solvent composition) may be recovered through total stripper recycling using the first to third distillation devices, and furthermore, the high-boiling-point stripper solvent discarded as a distillation residue together with high-boiling-point impurities may be additionally recovered through additional stripper recycling using a fourth distillation device, thus remarkably increasing the recycling yield of the expensive high-boiling-point stripper solvent and achieving environmental improvement effects as well as cost savings due to recycling of valuable resources.

As described hereinbefore, the present invention provides a system and method for recycling a high-boiling-point waste photoresist stripper. According to the present invention, in order to increase low recycling yield of a high-boiling-point stripper solvent which is a problem of a conventional recycling method, a high-quality recycled high-boiling-point stripper solvent can be recovered from a high-boiling-point waste photoresist stripper or a residue such as high-boiling-point impurities. Also, generation of high-boiling-point properties such as viscosification, thermal decomposition, etc. in a recycling process, and loss of recycled high-boiling-point stripper solvent can be minimized, thus easily increasing the recycling yield of the high-boiling-point stripper solvent.

Through total stripper recycling, a high-boiling-point recycled stripper (a stripper solvent composition) can be recovered, and through additional stripper recycling, a high-boiling-point stripper solvent discarded as a distillation residue together with the high-boiling-point impurities can be further recovered, thereby considerably increasing the recycling yield of the expensive high-boiling-point stripper solvent, ultimately achieving cost savings through reuse of valuable resources, and environmental improvement effects.

Also, separate stripper recycling can be optionally performed, so that the recovered high-boiling-point stripper solvent composition (mixture) can be separately recovered as individual stripper solvents.

Advanced recycling techniques able to recover expensive high-boiling-point stripper organic solvents through recycling and purification can be ensured, and the high-boiling-point stripper solvent which is an expensive valuable resource imported completely from abroad can be recovered in a large amount at high recovery efficiency and then reused, thereby achieving efficient energy management and enhancing IT-related company competitiveness.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A system for recycling a high-boiling-point waste photoresist stripper, the system comprising:

a first distillation device comprising a first feed inlet configured to receive the high-boiling-point waste photoresist stripper, the first distillation device configured to remove low-boiling-point impurities from the high-boiling-point waste photoresist stripper;

a second distillation device comprising a second feed inlet being connected to a bottom outlet of the first distillation device, the second distillation device configured to remove high-boiling-point impurities from the high boiling-point waste photoresist stripper without the low-boiling-point impurities, and simultaneously recover a stripper solvent composition;

a third distillation device being connected to a top outlet of the second distillation device, and configured to remove trace water from the stripper solvent composition without the high-boiling-point impurities; and a fourth distillation device connected to a bottom outlet of the second distillation device, and configured to perform second stripper recycling by additionally recovering a high-boiling-point stripper solvent from a high-boiling-point residue including the high-boiling-point impurities discharged by the second distillation device;

a fifth distillation device connected to the top outlet of the second distillation device, connected to a top outlet of the fourth distillation device, and configured to perform third stripper recycling by sequentially and separately recovering, as individual high-purity electronic grade recycled stripper solvents, the stripper solvent composition recovered by the second distillation device and the high-boiling-point stripper solvent additionally recovered by the fourth distillation device, based on a boiling point of each stripper solvent of the stripper solvent composition.

2. The system of claim 1, wherein the first distillation device comprises:
  a distillation tower, which has 15~25 theoretical plates for purification and receives the pretreated high-boiling-point waste photoresist stripper;
  a reboiler connected to a bottom of the distillation tower and set to a temperature of 80° C. or less so as to heat the waste stripper transported to the distillation tower to evaporate the low-boiling-point impurities;
  a condenser connected to a top of the distillation tower so as to condense the extracted low-boiling-point impurities;
  a temporary storage tank connected to the condenser so that the low-boiling point impurities condensed by the condenser are temporarily stored;
  a second transport pump and a separate collection tank connected side by side to an outlet of the temporary storage tank to discharge the low-boiling-point impurities recovered in the temporary storage tank; and
  a third transport pump connected to an outlet of the reboiler to transport the waste stripper without the low-boiling-point impurities to the second distillation device.

3. The system of claim 2, wherein a vacuum pump is connected to a top of the temporary storage tank to reduce an inner pressure of the distillation tower so that vacuum operation is carried out, in order to prevent promotion of thermal decomposition when the high-boiling-point waste photoresist stripper in the distillation tower is heated.

4. The system of claim 1, wherein the second distillation device comprises:
  a distillation tower, which has 7~15 theoretical plates for purification and receives the waste stripper transported from the reboiler of the first distillation device;
  a reboiler connected to a bottom of the distillation tower and set to a temperature of 160° C. or less so as to heat the waste stripper transported to the distillation tower to evaporate the stripper solvent composition;
  a condenser connected to a top of the distillation tower so as to condense the extracted stripper solvent composition;
  a temporary storage tank for temporarily storing the stripper solvent composition recovered after having been condensed by the condenser; and
  a fifth transport pump and a sixth transport pump connected side by side to an outlet of the temporary storage tank so that the stripper solvent composition recovered in the temporary storage tank is transported to the third distillation device.

5. The system of claim 4, wherein a vacuum pump is connected to a top of the temporary storage tank to reduce an inner pressure of the distillation tower so that vacuum operation is carried out, in order to prevent promotion of thermal decomposition when a stripper solvent component contained in the waste stripper in the distillation tower is heated.

6. The system of claim 1, wherein the third distillation device comprises:
  a distillation tower, which has 25~35 theoretical plates for purification and receives the stripper solvent composition obtained by the second distillation device;
  a reboiler separately connected to a bottom of the distillation tower and set to a temperature of 110° C. or less to remove trace water from the stripper solvent composition transported to the distillation tower;
  a condenser connected to a top of the distillation tower so that the removed trace water and volatiles are condensed to be re-circulated to the first distillation device;
  an additional condenser connected to the top of the distillation tower so as to condense a part of the stripper solvent which is volatilized from the top of the tower;
  a temporary storage tank for temporarily storing the part of the stripper solvent condensed by the additional condenser; and
  an eighth transport pump for finally transporting the stripper solvent in the temporary storage tank and the remaining stripper solvent in the bottom of the distillation tower and the reboiler, to a recycled stripper mixture storage tank.

7. The system of claim 6, wherein a vacuum pump is connected to a top of the temporary storage tank to reduce an inner pressure of the distillation tower so that vacuum operation is carried out, in order to prevent promotion of thermal decomposition when a stripper solvent component contained in the waste stripper in the distillation tower is heated.

8. The system of claim 1, wherein the fourth distillation device for said second stripper recycling comprises:
  a temporary storage tank for temporarily storing a waste byproduct which is a high-boiling-point residue left behind in the bottom of the tower of the second distillation device and the reboiler;
  a distillation tower, which has 8~12 theoretical plates for purification and receives the waste byproduct in the temporary storage tank by actuation of a ninth transport pump;
  a reboiler separately connected to a bottom of the distillation tower and set to a temperature of 160° C. or less so as to heat the waste byproduct transported to the distillation tower to evaporate the stripper solvent composition;

a condenser connected to a top of the distillation tower so as to condense the stripper solvent volatilized from the waste byproduct;

a temporary storage tank for recovering and temporarily storing the condensed stripper solvent; and a twelfth transport pump and a thirteenth transport pump connected to an outlet of the temporary storage tank so as to transport the recovered stripper solvent to the recycled stripper mixture storage tank.

9. The system of claim 8, wherein a vacuum pump is connected to a top of the temporary storage tank to reduce an inner pressure of the distillation tower so that vacuum operation is carried out, in order to prevent promotion of thermal decomposition when a high-boiling-point stripper solvent component of the waste byproduct in the distillation tower is heated.

10. The system of claim 8, wherein the fourth distillation device further comprises, as control members for maximally increasing a recycling yield of the stripper solvent composition while maximally retarding deposition of a photoresist resin:

a viscometer for monitoring an extent of viscosification of the high-boiling-point stripper solvent contained in the high-boiling-point residue when the photoresist resin, which is not sufficiently concentrated, of the waste byproduct in the reboiler is transported to an impurity collection tank and discarded;

a first flow rate control valve disposed together with a tenth transport pump in a circulation line upwards from an outlet of the reboiler;

a second flow rate control valve disposed together with an eleventh transport pump in a connection line between the outlet of the reboiler and the collection tank; and a controller for controlling opening/closing of the first and second flow rate control valves depending on measurement results of the viscometer.

11. The system of claim 1, wherein the fifth distillation device for said third stripper recycling comprises:

a spiral spinning band type distillation tower including therein a spiral stirring type column device made of metal or Teflon so that the stripper solvent composition recovered through the second removal step using the second distillation device, and the high-boiling-point stripper solvent recovered using the fourth distillation device are recovered as individual high-purity electronic grade recycled stripper solvents depending on a boiling point.

12. The system of claim 6, wherein a 1-micron filter is disposed in a connection line between the outlet of the temporary storage tank of the third distillation device and the recycled stripper mixture storage tank, and in a connection line between an outlet of the fifth distillation device and individual stripper solvent storage tanks.

* * * * *